United States Patent [19]

Tarui et al.

[11] 3,919,006

[45] Nov. 11, 1975

[54] METHOD OF MANUFACTURING A LATERAL TRANSISTOR

[76] Inventors: Yasuo Tarui, 6-4, 5-Chome, Minamisawa, Karume, Kitatama-Gun, Tokyo-To; Toshihiro Sekigawa, 4,3-Chome, Kogaya, Kanagawa-Ku, Yokohama, Kanagawa; Yutaka Hayashi, 9-14, 4-Chome, Hon, Hoya, Tokyo-To, all of Japan

[22] Filed: Sept. 18, 1973

[21] Appl. No.: 398,391

Related U.S. Application Data

[62] Division of Ser. No. 29,006, April 16, 1970, Pat. No. 3,764,396.

[30] Foreign Application Priority Data

Sept. 18, 1969 Japan ................................ 44-73847
Sept. 18, 1969 Japan ................................ 44-73848

[52] U.S. Cl. .................... 148/175; 29/576; 29/580; 148/187; 148/190; 148/191; 357/23; 357/35; 357/56

[51] Int. Cl.$^2$ .................... H01L 21/22; H01L 29/72

[58] Field of Search ........... 148/175, 187, 190, 191; 29/576, 580; 357/35

[56] References Cited

UNITED STATES PATENTS

| | | | |
|---|---|---|---|
| 3,370,995 | 2/1968 | Lowery et al. | 148/175 |
| 3,511,724 | 5/1970 | Ohta | 148/190 X |
| 3,558,375 | 1/1971 | Engeler | 148/175 |
| 3,577,045 | 5/1971 | Engeler et al. | 317/235 |
| 3,655,457 | 4/1972 | Duffy et al. | 148/1.5 |
| 3,740,276 | 6/1973 | Bean | 148/175 |

*Primary Examiner*—L. Dewayne Rutledge
*Assistant Examiner*—W. G. Saba
*Attorney, Agent, or Firm*—Robert E. Burns; Emmanuel J. Lobato; Bruce L. Adams

[57] ABSTRACT

Disclosed herein is a method of manufacturing a lateral transistor, in which a semiconductor crystal comprising two layers, namely, a first layer and a second layer formed so that said first layer contains two conductivity types of impurities, that is, first and second impurities which are opposite to and the same as a conductivity type of impurities contained in the second layer, respectively, said second impurities being lower in concentration and greater in diffusion constant than the first impurities; a part of the semiconductor crystal being selectively etched until the second layer is exposed; a region which has the same conductivity type as the first layer and which is small in impurity concentration being formed by the epitaxial growth method in the thus etched part; then a main base region being formed by diffusing of the second impurities into the thus formed region, whereby various advantages such as alleviation of the Early effect, avoidance of punch-through, a high accuracy in control of a base width and reduction of a base resistance are obtained.

1 Claim, 7 Drawing Figures

METHOD OF MANUFACTURING A LATERAL TRANSISTOR

CROSS-REFERENCE TO RELATED APPLICATION

This application is a divisional application of our co-pending application Ser. No. 29,006, filed Apr. 16, 1970, now U.S. Pat. No. 3,764,396, entitled "TRANSISTORS AND PRODUCTION THEREOF."

BACKGROUND OF THE INVENTION

The present invention relates to a semiconductor device, and more particularly to a lateral transistor.

The term "lateral transistor" used herein is understood to be a transistor in which a flow of a main electrical current is parallel to a main surface of said transistor.

As well known, the conventional lateral transistor produced in a large scale comprises an emitter region 1, a collector region 2, a base region 3 and an operational region (main base region) 3-1. A width Wb (referred to as a base width) of the operational region 3-1 is defined by a distance between the emitter region 1 and the collector region 2. The regions 1 and 2 are formed by means of impurity diffusion. Therefore, a minimum value of the base width Wb is limited in accordance with a photograving accuracy and the minimum value available at the present time is $1\mu$ at best.

As a matter of fact, characteristics of the transistor are mainly determined by the base width Wb, and a width Wb on $1\mu$ corresponds to a frequency ft of the order of 100 MHz. Therefore, it is impossible to employ the lateral transistor of the prior art at an ultra high frequency at the present time.

Now, even if it were possible to make the base width Wb less than $1\mu$, the lateral transistor would be in danger of breaking down due to the following reasons. That is, a high frequency characteristic of the lateral transistor is limited by modulation (Early effect) of the base width Wb which is caused mainly by the extension of a depletion layer from the collector region side to the main base region because an impurity concentration in the main base region 3–1 is lower than that in the collector region 2, and the elements of the transistor will not operate normally because of a punch-through (which means that the emitter region 1 and the collector region 2 are conductively connected to each other by the depletion layer).

In order to eliminate these disadvantages as mentioned above, a structure of a transistor as shown in FIG. 2 has been proposed by Hugle. However, in this structure, a collector region is in contact with a base region having low resistance over a large area thereof, and capacity $C_c$ between the collector and the base is therefore large, as a result of which a maximum frequency determined from a formula $$f\ max = \sqrt{\frac{fx}{8\pi \tau_B' C_c}}$$

is still low. Furthermore, the end of a diffusion mask is eroded by an impurity gas in double diffusion, and the part thus eroded comes to lose it effectiveness as a mask. Therefore, it is impossible to control the base width as accurately as theoretically estimated.

SUMMARY OF THE INVENTION

It is accordingly a first object of the present invention to considerably eliminate drawbacks involved in the conventional lateral transistor, thereby to produce a lateral transistor having an ultra high frequency characteristic. This object can be achieved by making a base width of the transistor less than $1\mu$, by making a base resistance small and by making small the capacity $C_c$ between the collector and the base.

Another object of the present invention is to improve accuracy in manufacturing of the base width by utilization of a method which comprises a step of providing a region, which is low in impurity concentration, on the collector side and a step of diffusing impurities after having been introduced into a crystal.

The nature, utility and principle of the present invention will be more clearly understood from the following detailed description when read in conjunction with the accompanying drawings.

DETAILED DESCRIPTION OF THE INVENTION

Figure 1:
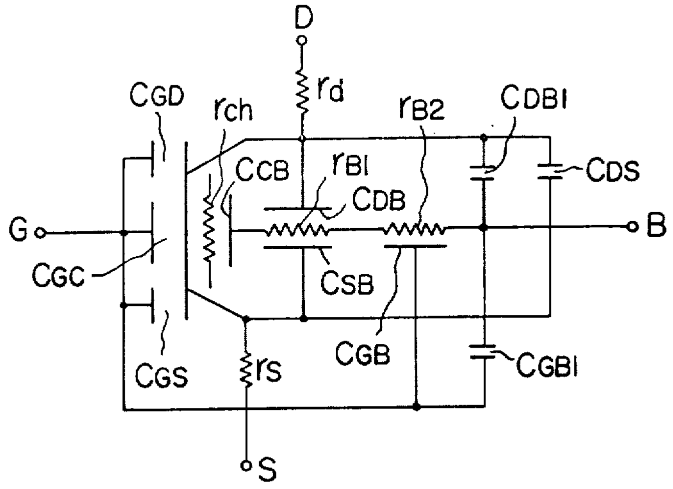
FIGS. 1 and 2 are sectional views of conventional lateral transistors.
Figure 2:
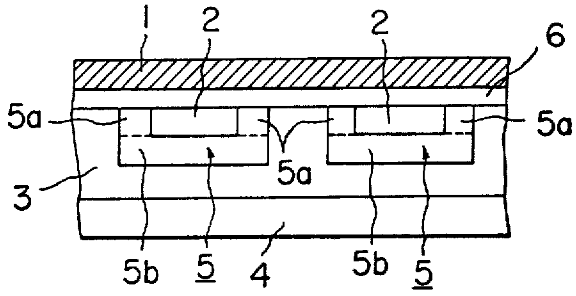
FIG. 2 (PRIOR ART)
Figure 3A:
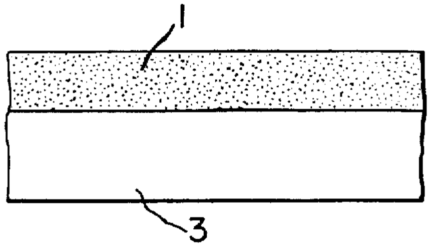
FIG. 3 shows steps in manufacturing a lateral transistor according to a method of the present invention.
Figure 3B:
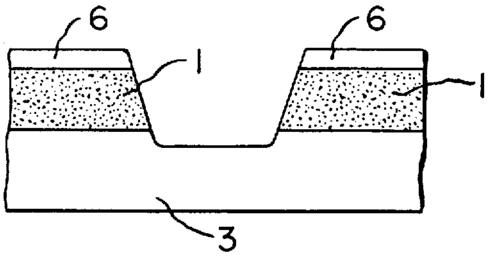
Figure 3C:
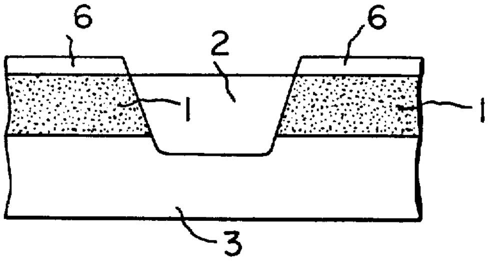
Figure 3D:
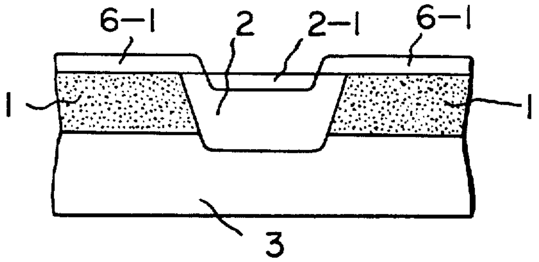
Figure 3E:
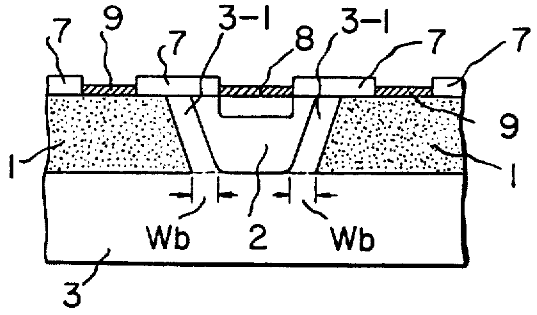

With reference now to FIG. 3, there is shown an example of a method of manufacturing a lateral transistor according to the present invention, which is in this case for an npn-type transistor.

As shown in FIG. 3(*a*), first of all a n-type semiconductor region 1 including p-type impurities which are higher in impurity concentration than a collector region 2, is formed in a p-type semiconductor substrate 3. The n-type impurities used in this case are slower in diffusion speed than p-type impurities in said substrate 3. Then, a part of the region 1 is subjected to a selective-etching operation in compliance with a photoengraving method until the substrate 3 is exposed, as shown in FIG. 3(*b*). Next, an $n^-$-type semiconductor region 2 is formed in accordance with a selective epitaxial growth and in this case the impurity concentration in the region 2 is made lower than that in the region 1 (FIG. 3(*c*)). Then, an $n^+$-type semiconductor region 2-1 is formed by a selective-diffusion method, as shown in FIG. 3(*d*). The formation of an $n^+$-type semiconductor region may be continuously conducted by increasing the impurity gas concentration during the formation of the $n^-$-type semiconductor region 2. At the same time or in the next manufacturing step, a main base region 3-1 is formed by thermal diffusion, as shown in FIG. 3(*e*). Manufacturing the lateral transistor according to the present invention is ended with formation of electrodes. The thus manufactured transistor finally comprises masks 6-1 and 6 which serve to control the selective diffusion and an $n^-$-type region formed by selective epitaxial growth and from which is formed, an insulation film 7, a collector electrode 8, and emitter electrode 9, an emitter region 1, a collector region 2, and a base region 3. In the above-described embodiment, a gate electrode may be provided on the main base region 3-1 through the insulation film so as to control a surface potential.

As apparent from the foregoing description, reduction of the capacity $C_c$, which has not been obtained by the conventional lateral transistor can be achieved according to the present invention. In addition to the above, the following advantages are derived from the present invention, that is, alleviation of the Early effect, with resultant avoidance of punch-through, and increased effectiveness at a high frequency, resulting from control of the base width with a high accuracy and reduction of the base resistance. Impurities contained in the crystal diffuse into another crystal region, and therefore there is no such a disadvantage in the control of the base width that the accuracy thereof is lowered due to difficulty such as erosion of the diffusion mask, in the actual process manufacturing the transistor. Consequently, the base width is determined with a high accuracy.

1. A method of manufacturing a lateral transistor which comprises the steps of; forming as a layer on a substrate of semiconductor material which contains an impurity of a first conductivity type, a first region containing an impurity having a high diffusion characteristic of the same type as said substrate and an impurity of the opposite conductivity type having a high concentration and low diffusion characteristic; providing a mask over said first region; providing a window in said mask; forming through said first region a recess to expose said substrate through said window; successively depositing in said recess by epitaxial growth through said window lightly doped second and heavily doped third regions of semiconductor material of said opposite conductivity type, said third region being isolated from said first region by said second region; effecting by heat diffusion a diffusion of impurity of said first conductivity type from said first region into said second region to form between said first and second regions a base region the width of which is determined by the difference in diffusion of said impurities of said first conductivity type and said second conductivity type; and forming electrical contacts with said first, third and base regions, respectively.

* * * * *

UNITED STATES PATENT AND TRADEMARK OFFICE

CERTIFICATE OF CORRECTION

PATENT NO. : 3919006

DATED : 11 November 1975

INVENTOR(S) : Yasuo Tarui; Toshihiro Sekigawa; Yutaka Hayashi

It is certified that error appears in the above-identified patent and that said Letters Patent are hereby corrected as shown below:

[73] Assignee: Kogyo Gijutsuin, Tokyo-to, Japan

Signed and Sealed this

Twenty-eighth Day of June 1977

[SEAL]

*Attest:*

RUTH C. MASON
*Attesting Officer*

C. MARSHALL DANN
*Commissioner of Patents and Trademarks*